(12) United States Patent
Sadovnikov et al.

(10) Patent No.: US 11,469,315 B2
(45) Date of Patent: Oct. 11, 2022

(54) BIPOLAR JUNCTION TRANSISTOR WITH BIASED STRUCTURE BETWEEN BASE AND EMITTER REGIONS

(71) Applicant: TEXAS INSTRUMENTS INCORPORATED, Dallas, TX (US)

(72) Inventors: Alexei Sadovnikov, Sunnyvale, CA (US); Natalia Lavrovskaya, Sunnyvale, CA (US); Guruvayurappan Mathur, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/017,341

(22) Filed: Sep. 10, 2020

(65) Prior Publication Data

US 2021/0210625 A1 Jul. 8, 2021

Related U.S. Application Data

(60) Provisional application No. 62/957,880, filed on Jan. 7, 2020.

(51) Int. Cl.
*H01L 29/735* (2006.01)
*H01L 29/66* (2006.01)
*H01L 29/423* (2006.01)

(52) U.S. Cl.
CPC ...... *H01L 29/735* (2013.01); *H01L 29/42304* (2013.01); *H01L 29/6625* (2013.01)

(58) Field of Classification Search
CPC ............... H01L 29/735; H01L 29/6625; H01L 29/42304
See application file for complete search history.

(56) References Cited

U.S. PATENT DOCUMENTS

| | | | |
|---|---|---|---|
| 10,224,402 B2 | 3/2019 | Lavrovskaya et al. | |
| 10,269,895 B2 | 4/2019 | Babcock et al. | |
| 10,522,663 B2 | 12/2019 | Sadovnikov et al. | |
| 2010/0279481 A1* | 11/2010 | Babcock | H01L 29/66242 438/311 |
| 2011/0049678 A1* | 3/2011 | Benaissa | H01L 29/66325 257/591 |
| 2019/0165129 A1 | 5/2019 | Sadovnikov et al. | |

* cited by examiner

*Primary Examiner* — Syed I Gheyas
(74) *Attorney, Agent, or Firm* — Andrew R. Ralston; Charles A. Brill; Frank D. Cimino

(57) ABSTRACT

In a described example, a bipolar junction transistor includes a substrate. An emitter region, a base region, and a collector region are each formed in the substrate. A gate-type structure is formed on the substrate between the base region and the emitter region. A contact is coupled to the gate-type structure, and the contact is adapted to be coupled to a source of DC voltage.

15 Claims, 19 Drawing Sheets

BIPOLAR JUNCTION TRANSISTOR WITH BIASED STRUCTURE BETWEEN BASE AND EMITTER REGIONS

RELATED APPLICATION

This application claims priority from U.S. Provisional Patent Application Ser. No. 62/957,880, filed Jan. 7, 2020, and entitled BJT WITH BIASED POLY PLATE BETWEEN EMITTER AND BASE REGIONS, which is incorporated herein by reference in its entirety.

TECHNICAL FIELD

This description relates to a bipolar junction transistor with a biased structure located between base and emitter regions.

BACKGROUND

Bipolar junction transistors (BJTs) use two junctions between two semiconductor types, n-type and p-type, which are regions in a single crystal of material. BJTs are used for amplification of signals, switching, and in digital circuits, such as high voltage switches, for radio-frequency amplifiers, or for switching heavy currents. In such applications, it is desirable for bipolar junction transistors to exhibit relatively high Hfe (high transistor beta) as well as collector current vs base-emitter voltage (Vbe) linearity.

SUMMARY

In a described example, a bipolar junction transistor includes a substrate. An emitter region, a base region, and a collector region are each formed in the substrate. A gate-type structure is formed on the substrate between the base region and the emitter region. A contact is coupled to the gate-type structure, and the contact is adapted to be coupled to a source of DC voltage.

Another described example relates to a method of forming a transistor. the method includes forming a collector region having majority carriers of a first type in a semiconductor substrate. The method also includes forming a base region having majority carriers of a second type and forming a gate-type structure over the base region. The method also includes etching the gate-type structure to expose an emitter area of the base region and to expose a base contact area of the base region, the base contact area surrounding the gate-type structure. The method also includes implanting a first dopant in the emitter area to form an emitter region having majority carriers of the first type. The method also includes implanting a second dopant in the base contact area of the base region to form a base contact region having majority carriers of the second type. Contacts are formed on or over the base contact region, the emitter contact region, the collector contact region and the gate-type structure. A gate connector is coupled to the contact of the gate-type structure and is adapted to be coupled to a source of DC voltage.

A further described example provides a method of forming an integrated circuit. The method includes implanting a dopant having a first conductivity type into a semiconductor substrate to form a first doped region having the first conductivity type. The method also includes implanting a dopant having a second different conductivity type into the first doped region to form a second doped region within the first doped region and having the second conductivity type. The method also includes forming a polysilicon gate-type structure over the first doped region between an area of the second doped region and a contact area of the first doped region. The method also includes forming a gate connector coupled to the polysilicon gate-type structure, wherein the gate connector is electrically isolated from the first doped region and the second doped region.

DETAILED DESCRIPTION

Example embodiments relate to bipolar junction transistor (BJT). The BJT may exhibit improved beta relative to collector current (Ic) ideality. The BJT has an emitter contact region and a base contact region that are separated from each other by a gate structure. For example, the gate structure is formed of polysilicon and is coupled to a terminal for application of a direct current (DC) bias voltage. The DC bias voltage applied to the gate structure reduces lateral current flow in the BJT between the emitter and base regions. The gate structure may be formed without requiring a dedicated base mask as may be used to add high-dose low-energy implants to the base region to increase surface dopants between emitter and base contact regions. As a result, the BJT described herein may be fabricated at a lower cost than other methods and exhibit comparable or improved performance.

Figure 1:
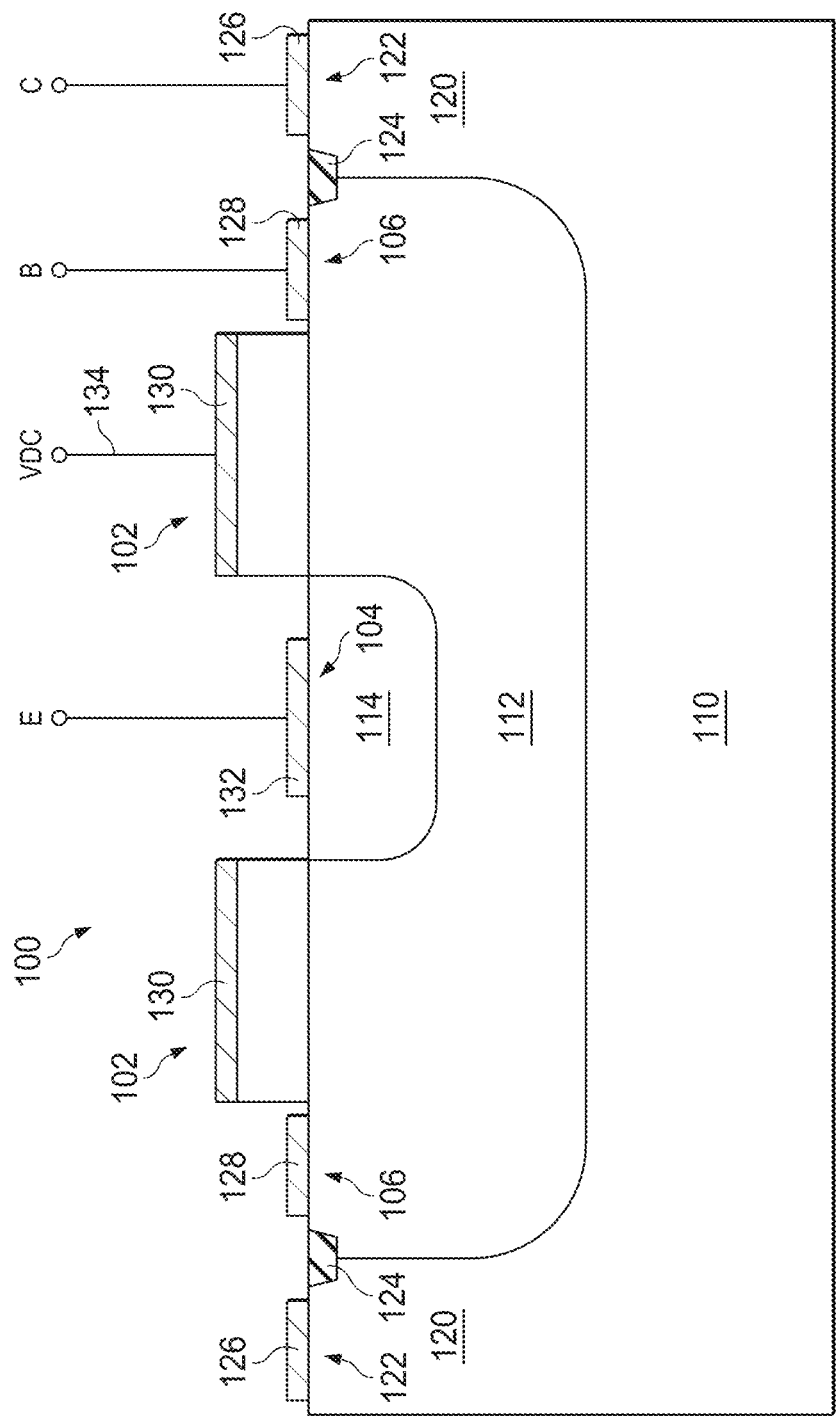
FIG. 1 is a cross-sectional view of an example of a bipolar junction transistor.

FIG. 1 depicts a cross-sectional view of a transistor 100 that includes gate-type structure 102 between emitter and base contact regions 104 and 106. For example, the gate-type structure 102 is referred to as a gate-type structure because the structure is formed over a gate oxide layer (not shown) in conjunction with forming gates in a CMOS process. As a further example, the gate-type structure 102 includes a polysilicon gate material, which may be doped with N-type or P-type dopants (e.g., via implantation or as-deposited when forming the structure). The gate oxide electrically insulates the gate material from base region 112. The gate-type structure 102 also surrounds the emitter region 114. In operation, the gate-type structure 102 may be coupled to a source of a DC bias voltage (VDC) through one or more electrical connectors 134. This is in contrast to other approaches that might couple the gate structure to the emitter. Use of an independent connector to bias the gate-type structure 102 with a DC voltage that is electrically isolated from the emitter region 114, as described herein, reduces lateral current flow in the transistor between the emitter and base contact regions. As a result, the transistor 100 can exhibit improved transistor beta (Hfe) versus collector current (Ic) as well as improved Ic versus Vbe ideality.

As a further example, the transistor is a BJT that includes a collector region 110, a base region 112, and an emitter region 114 formed in a substrate, such as a semiconductor substrate or epitaxial layer that may be grown or deposited on the semiconductor. In some examples, the transistor 100 is a PNP transistor, where the collector region 110 and the emitter region 114 are P-type semiconductors, and the base region 112 is an N-type semiconductor. For a PNP transistor, the collector region 110 and the emitter region 114 can be fabricated by implanting acceptor dopants into a silicon semiconductor, and the base region 112 can be fabricated by implanting donor dopants into the silicon semiconductor.

In other examples, the transistor is an NPN transistor, where the collector region 110 and the emitter region 114 are N-type semiconductors, and the base region 112 is a P-type semiconductor. For an NPN transistor, the collector region 110 and the emitter region 114 can be fabricated by implanting donor dopants into a silicon semiconductor, and the base region 112 can be fabricated by implanting acceptor dopants into the silicon semiconductor.

As a further example, the transistor is implemented as a BJT that includes a collector region 110. For example, dopants are implanted in the collector region 110 to form a well 120, and dopants are implanted in the well 120 to form a collector contact region 122. The collector contact region 122 may be formed by source-drain implantation or other methods. A shallow trench isolation (STI) region 124 may be formed between the collector contact region 122 and the base contact region 106 to provide electrical isolation.

A respective metal layer is provided over each contact region to form a collector contact 126, a base contact 128, a gate contact 130 and an emitter contact 132. The gate contact is electrically isolated from the emitter contact and the base contact, such as by an insulating material (not shown) formed over the exposed portions of the transistor 100. Each contact 126, 128, 130 and 132 may be coupled to a separate terminal of an IC chip that includes the transistor 100 and/or to other circuitry integrated within the IC chip. In the example of FIG. 1, a gate connector 134 couples the gate contact 130 of the gate-type structure 102 to a source of DC voltage, demonstrated schematically as VDC. For example, the source of DC voltage is a terminal of the IC chip implementing the transistor 100. In one example, the DC voltage terminal may be coupled an external DC voltage (VDC), such as may reside on another IC chip or other external circuit. In another example, the DC voltage terminal may be coupled to a DC voltage (VDC) that is internal to the IC chip implementing the transistor 100. For example, the DC voltage VDC may be provided by a voltage regulator, a battery or other circuitry configured to provide the DC voltage to the DC voltage terminal 136. The DC voltage VDC may be a positive DC voltage or a negative DC voltage. The amplitude of the DC voltage at the DC voltage terminal 136 may vary depending on the type and configuration of transistor 100 as well as desired performance characteristics, such as including transistor beta transistor versus Ic as well as Ic versus Vbe ideality. As described herein, a minimum positive or negative magnitude of the DC voltage may be determined to operate the transistor within desired operating parameters (e.g., to reduce lateral current flow in the transistor 100) and thereby achieve desired performance.

For purposes of ease of explanation, FIG. 1 does not show the entire semiconductor substrate as part of a wafer in which other devices may be integrated with the example transistor 100. As an example, the collector region 110 may be fabricated within a well formed in the substrate, such as a semiconductor substrate or an epitaxial layer, and there may be shallow trench isolation (STI) regions to isolate the transistor 100 from other devices (not shown). The semiconductor material, upon which the example transistor 100 is fabricated, may be obtained from crystalline silicon grown from a seed, or the semiconductor material may also include epitaxial layers grown or deposited upon a semiconductor substrate.

Figure 2:
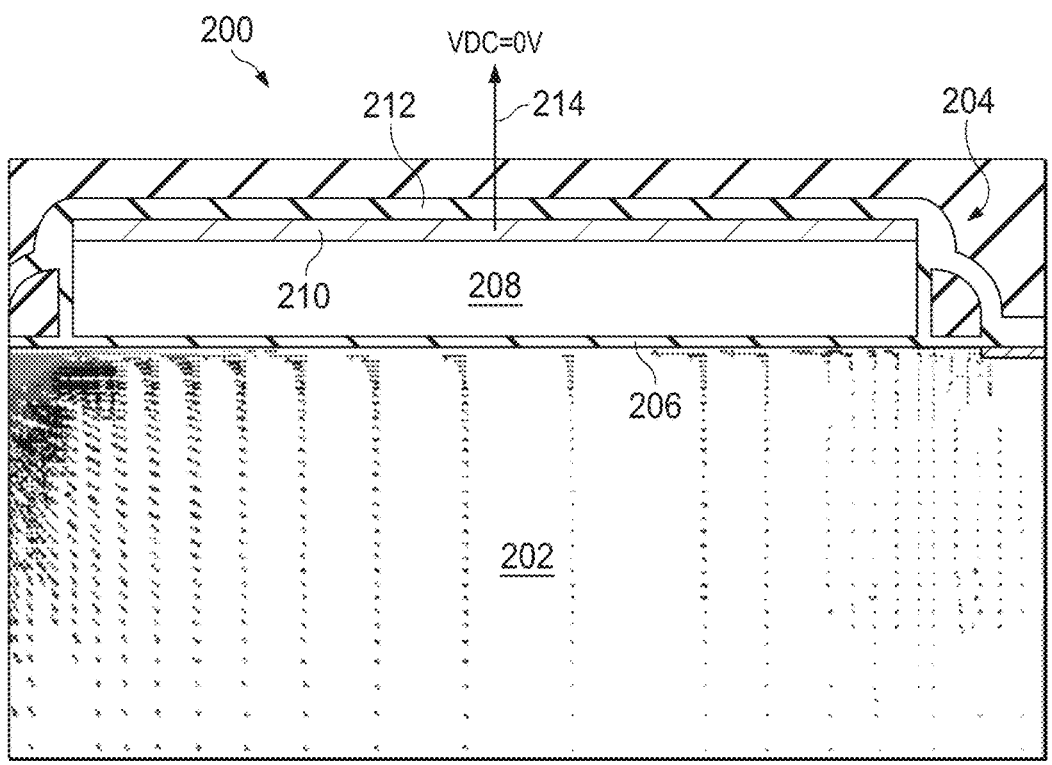
FIG. 2 depicts an example of electron current vectors for a region below a gate structure coupled to a first DC voltage.
Figure 3:
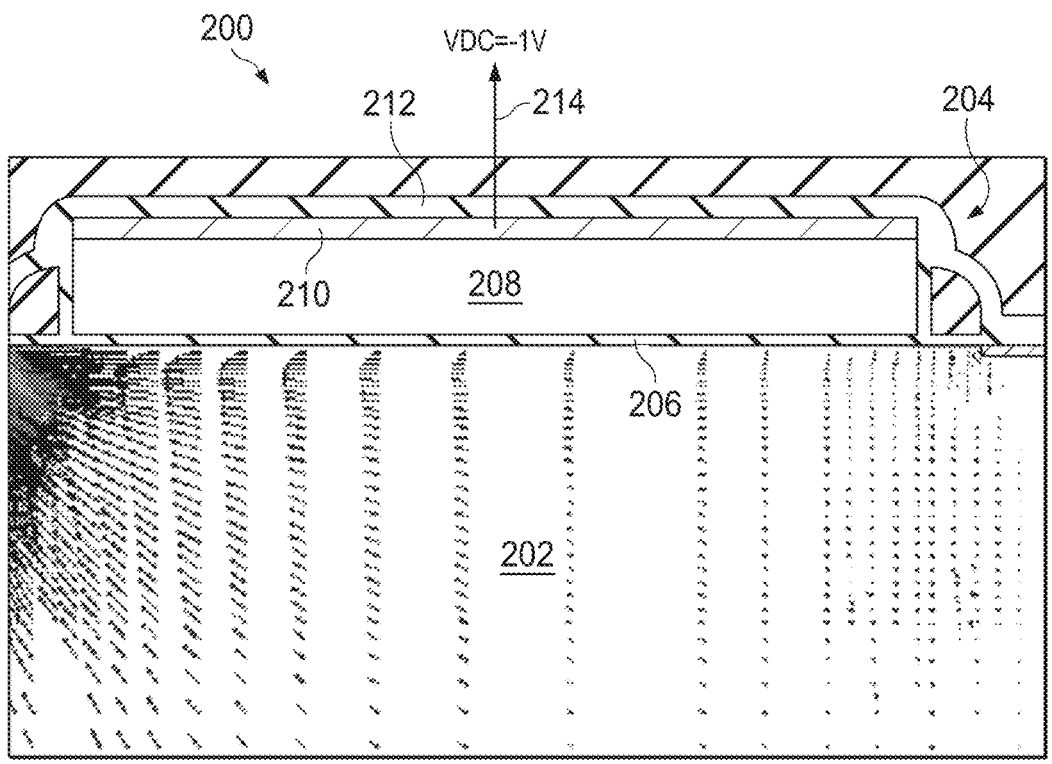
FIG. 3 depicts an example of electron current vectors for a region below a gate structure coupled to a second DC voltage.

FIGS. 2 and 3 are cross-sectional views of part of a transistor 200 including a base region 202 of a substrate below a gate-type structure 204 that is positioned between emitter and base contact regions. For example, the transistor corresponds to the transistor 100 and the gate-type structure 204 corresponds to the gate-type structure 102 of FIG. 1. Each of FIGS. 2 and 3 further illustrate vectors of electron current flow in the base region 202 of the transistor 200 having Vbe=0.6 V and Vce=2.5 V and for different bias voltages applied to the gate-type structure 204.

In the example of FIGS. 2 and 3, the gate-type structure 204 includes a gate oxide 206 formed over the base region 202. In some examples, the gate oxide 206 may include silicon dioxide ($SiO_2$), such as a high-quality oxide that is thermally grown on the semiconductor upon which the transistor 200 is fabricated. The gate-type structure 204 also includes gate material 208 formed over the gate oxide 206. The gate material 208 may include polysilicon, and may be doped with N-type or P-type dopants. For example, the polysilicon material may be formed through a complementary metal oxide semiconductor (CMOS) process. The CMOS process further may be used to form wells in the base and collector regions.

A metal contact 210 is formed over the gate material and an additional oxide layer 212 may be formed over the gate-type structure 204 as well as other exposed portions of the transistor 200. For example, the metal contact 210 may be a silicide that is deposited and annealed to form the contact of the gate-type structure 204. A connector 214 may be formed to couple the metal contact 210 to a source of a DC voltage, which is at 0 V in the example of FIG. 2 and is at −1 V in the example of FIG. 3.

The combination of the gate oxide 206, the gate material 208 and contact 210 collectively define the gates structure 204 disposed between the emitter region and the base contact region. When the gate-type structure 204 is biased by an appropriate DC voltage source (VDC), the gate structure will increase the concentration of holes near the surface of the base region and provide an additional potential barrier for electrons being injected laterally from the emitter region. This results in the electron flow being more vertical within the transistor 200 when the gate structure is biased to −1 V, as shown in FIG. 3, compared to when biased to 0 V, as shown in FIG. 2.

Figure 4:
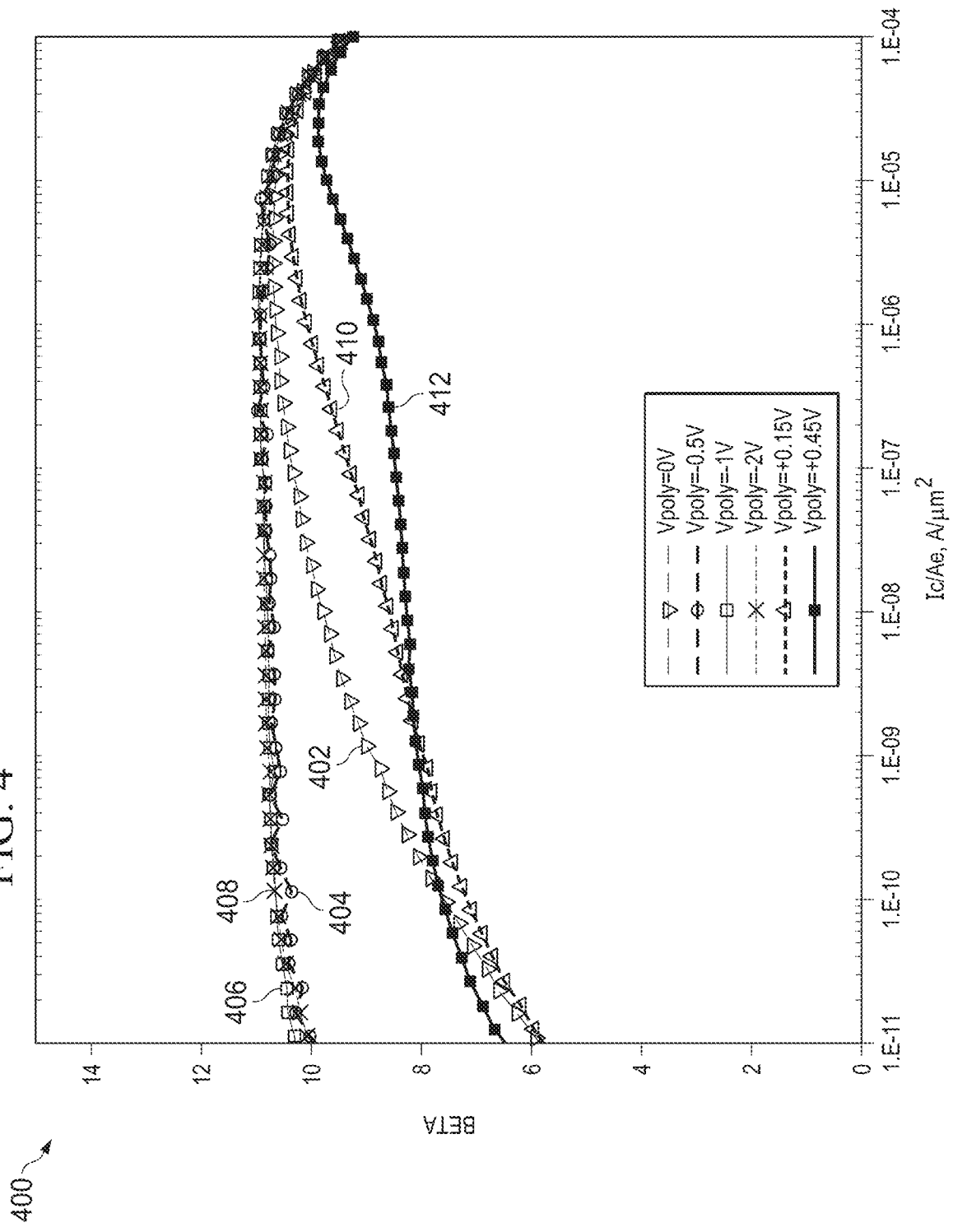
FIG. 4 is a graph plotting the beta value of a bipolar junction transistor as a function of collector current per area.

FIG. 4 is a graph 400 that includes plots 402, 404, 406, 408, 410 and 412 of transistor beta values of an NPN bipolar junction transistor as a function of collector current (Ic) per area for a plurality of different DC bias voltages (VDC) applied to a gate structure (the gate-type structure 102 of FIG. 1 or the gate-type structure 204 of FIGS. 2-3). In particular, the plot 402 shows the beta value for VDC=0V, the plot 404 shows beta values for VDC=−0.5V, plot 406 shows beta values for VDC=−1V, plot 408 shows beta values for VDC=−2V, plot 410 shows beta values for VDC=+0.15V and plot 412 shows beta values for VDC=+0.45V. Thus, for the NPN transistor, the plots 404, 406 and 408 demonstrate that beta versus Ic become more ideal when a negative DC bias is applied to the gate structure.

Figure 5:
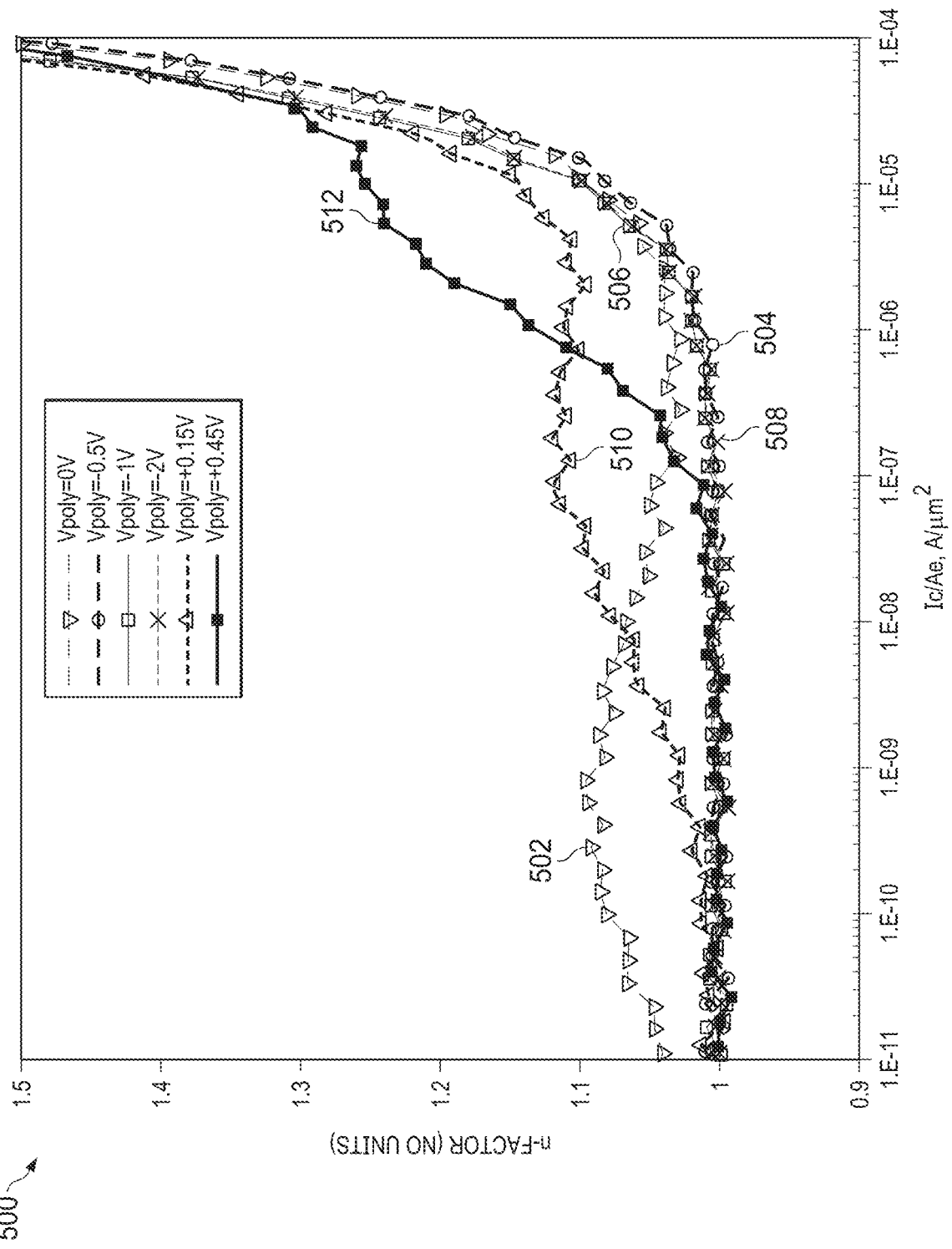
FIG. 5 is a graph plotting the n-factor value of a bipolar junction transistor as a function of collector current per area.

FIG. 5. is a graph 500 that includes plots 502, 504, 506, 508, 510 and 512 of the n-factor value of an NPN BJT, which is representative of Ic ideality, as a function of Ic per unit area. Similar to FIG. 4, the graph demonstrates that the Ic ideality factor exhibits good linearity when negative DC bias is applied to the gate structure, as shown by plots 504, 506 and 508, compared to 0 and positive DC bias shown by plots 502, 510 and 512.

Figure 6:
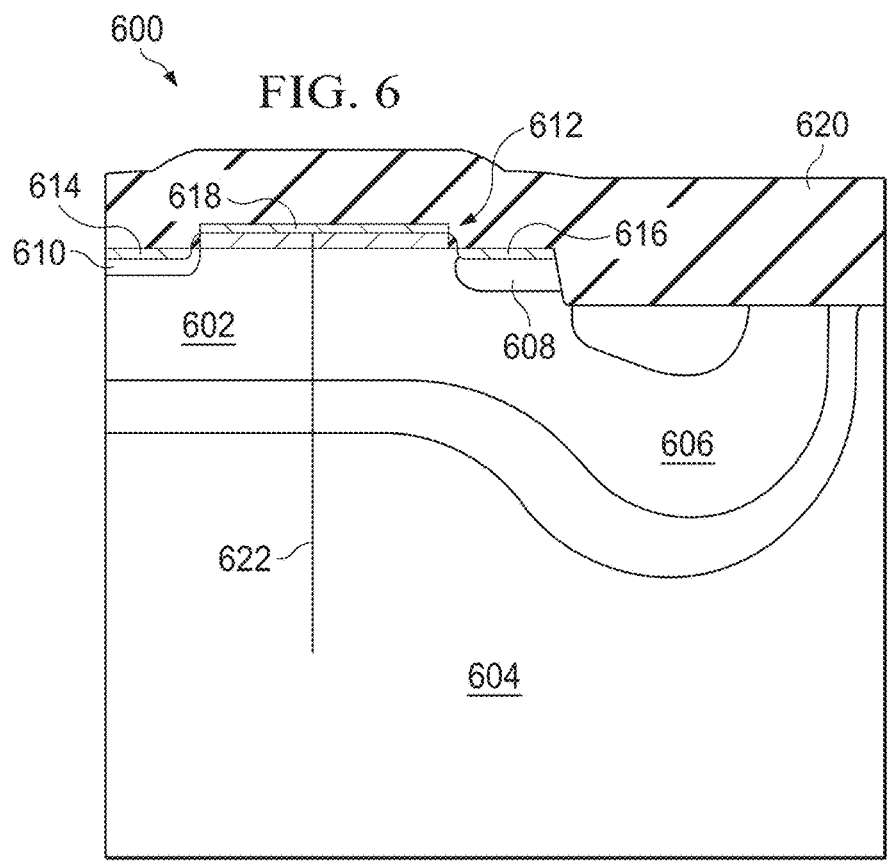
FIG. 6 is a cross-section view of part of a bipolar junction transistor.

FIG. 6 is a cross-section view of part of a transistor 600. In the example of FIG. 6, the transistor 600 is a high gain PNP BJT that includes a dedicated N-type base region 602 formed within a P-type collector region 604. For example, the collector region 604 includes a P-type epitaxial (Pepi) layer in which the N-type dopants are implanted to form the base region 602. The transistor 600 also includes an Nwell 606 that surrounds a base contact region 608, which may be formed by implanting N-type surface dopants around the base contact region through a CMOS process. An emitter region 610 is formed (e.g., by implanting P-type surface dopants) in the base region 602. A gate-type structure 612 is formed between the base contact region 608 and emitter region 610. For example, the gate structure 612 includes polysilicon layer formed over gate oxide, and the polysilicon may be doped (e.g., with N-type or P-type dopants) or non-doped, and may be formed through a CMOS process in conjunction with forming gates of one or more field effect transistors. A metal contact 614, 616 and 618 is formed over each of the emitter, base and gate structure, respectively. An oxide layer 620 further may be formed over the metal and exposed surface layers of the transistor 600. The oxide layer 620 (e.g., $SiO_2$) electrically isolates the metal contacts 614, 616 and 618 and provides support for connections to the metal contacts 618 made in vias formed through the oxide.

Figure 7:
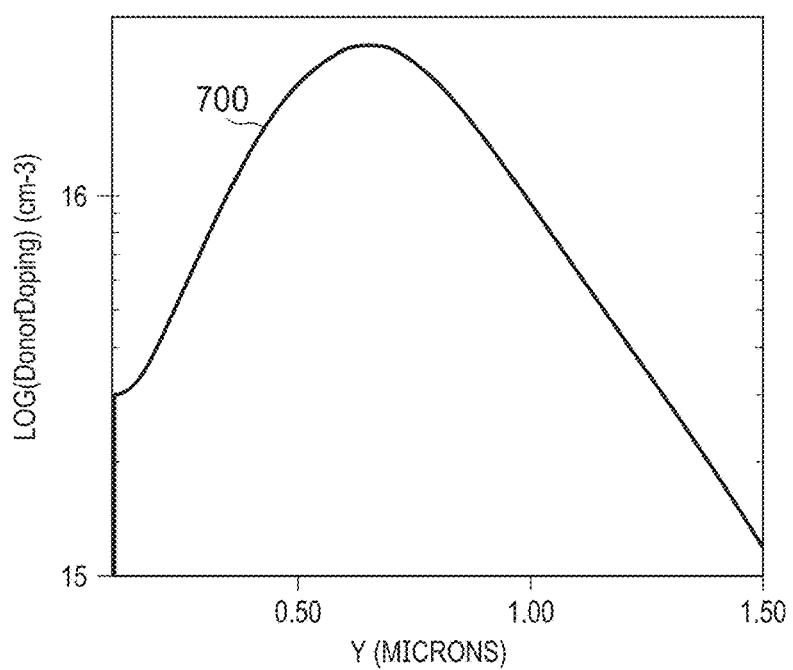
FIG. 7 is a plot of donor doping beneath the gate structure of the bipolar junction transistor of FIG. 6.

FIG. 7 is a plot 700 of vertical donor doping taken along a line 622 extending in a Y-axis direction beneath the gate structure 612 of the PNP transistor 600 of FIG. 6. As shown in FIG. 7, the doping is lower near the surface and increases through the Nbase of the base region 602, then decreasing into the collector region 604. By using a separate contact coupled to the gate contact 618 and applying a bias to the polysilicon gate structure 612, the Hfe (transistor beta) can increase versus collector current (Ic) per unit area as to improve Hfe linearity and Ic ideality when compared to BJT that do not include the independently biased gate structure.

Figure 8:
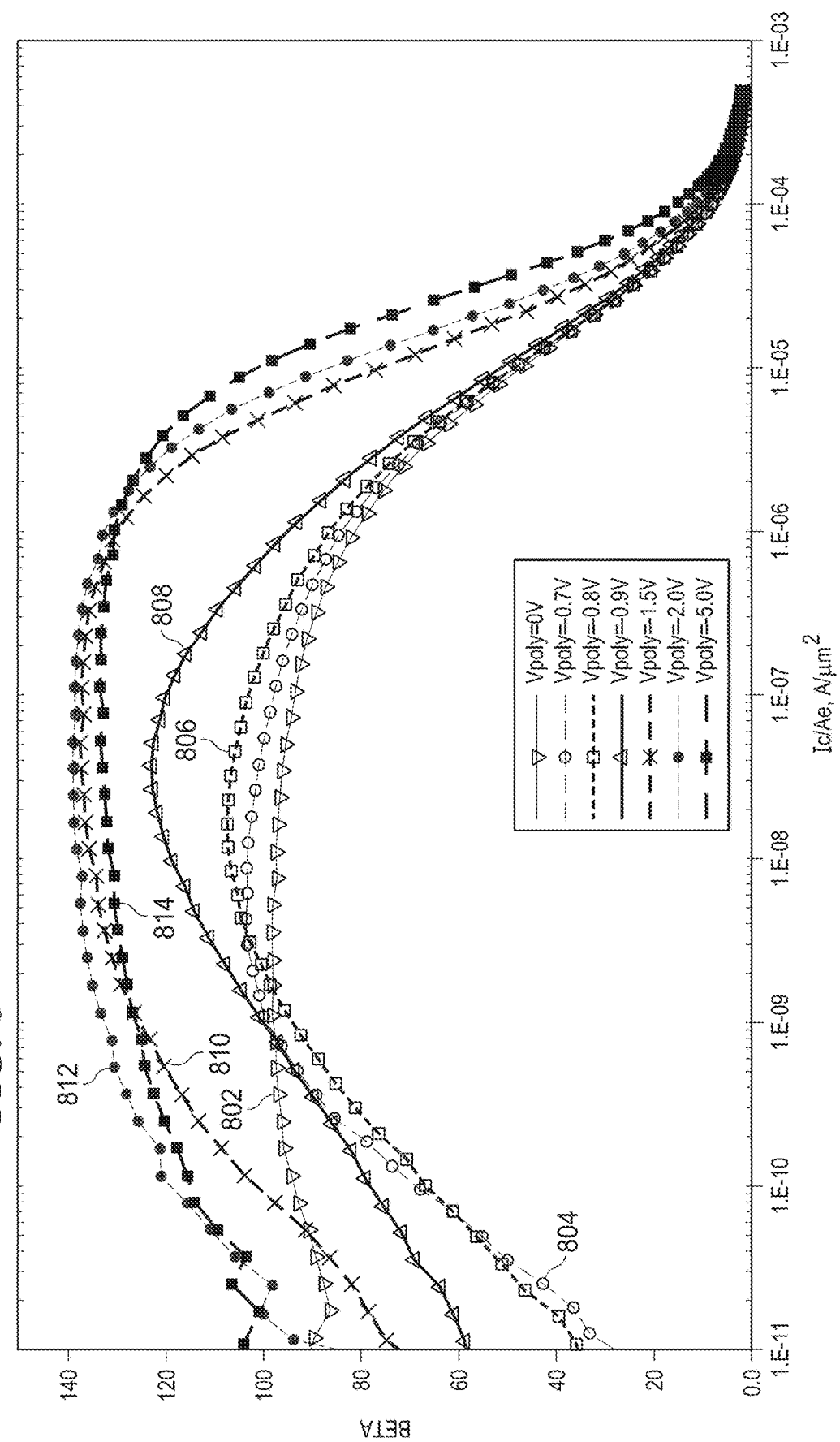
FIG. 8 is a graph plotting the beta value of the bipolar junction transistor of FIG. 6 as a function of collector current per area for different DC bias values.

FIG. 8 is a graph 800 that includes plots 802, 804, 806, 808, 810 and 812 of transistor beta values as a function of collector current (Ic) per area for a plurality of different DC bias voltages (VDC) applied to a gate structure (the gate-type structure 102 of FIG. 1 or the gate-type structure 612 of the PNP bipolar junction transistor 600 of FIG. 6. In particular, the plot 802 shows the beta value for VDC=0V, the plot 804 shows beta values for VDC=−0.7V, plot 806 shows beta values for VDC=−0.8V, plot 808 shows beta values for VDC=−0.9V, plot 810 shows beta values for VDC=−1.5V, plot 812 shows beta values for VDC-2.0V and plot 814 show beta values for VDC=−5.0V. Thus, for the PNP transistor 600, the plots 810, 812 and 814 demonstrate that beta versus Ic become more ideal when a sufficiently negative DC bias is applied to the gate structure 612 of −1.5V or less (more negative).

Figure 9:
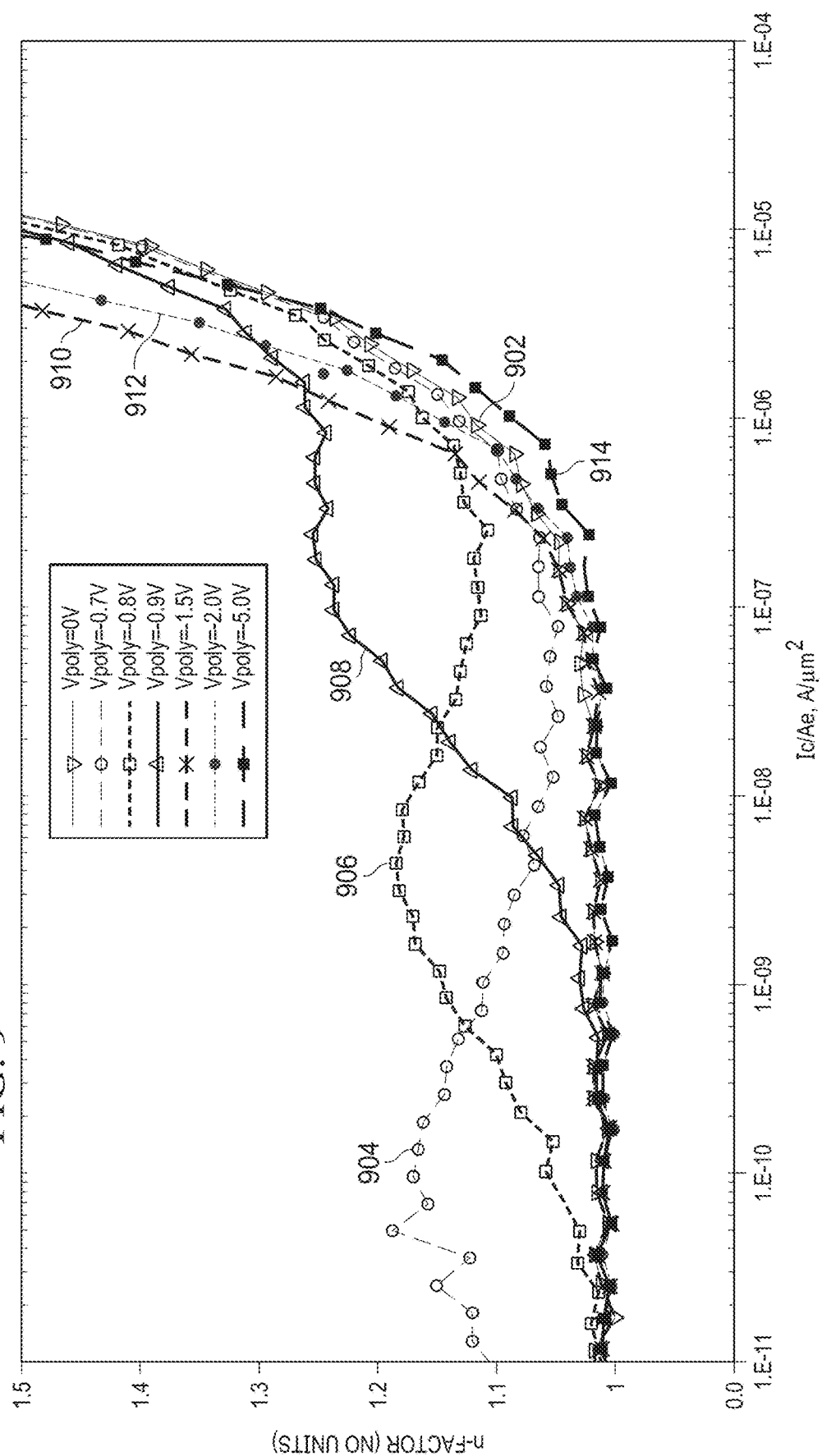
FIG. 9 is a graph plotting the n-factor value of a of the bipolar junction transistor of FIG. 6 as a function of collector current per area for different DC bias values.

FIG. 9 is a graph 900 that includes plots 902, 904, 906, 908, 910, 912 and 914 of the n-factor value of an NPN BJT, which is representative of Ic ideality, as a function of Ic per unit area. Similar to FIG. 8, the graph demonstrates that the Ic ideality factor exhibits good linearity when a negative DC bias of −1.5V or less is applied to the gate structure 612, as demonstrated in plots 910, 912 and 914, compared to plots 904, 906 and 908. Where IC ideality is a desired transistor parameter but transistor beta is not a concern, a 0V bias may be applied to gate structure, as shown by plot 902 which provides a reasonable ideality factor comparable to the negative bias. However, as demonstrated in FIG. 8, a 0V bias would result in a lower transistor bias, which may be unsuitable in some applications. Therefore, the bias may be set for a given transistor according to its particular application requirements and desired operating parameters.

Figure 10:
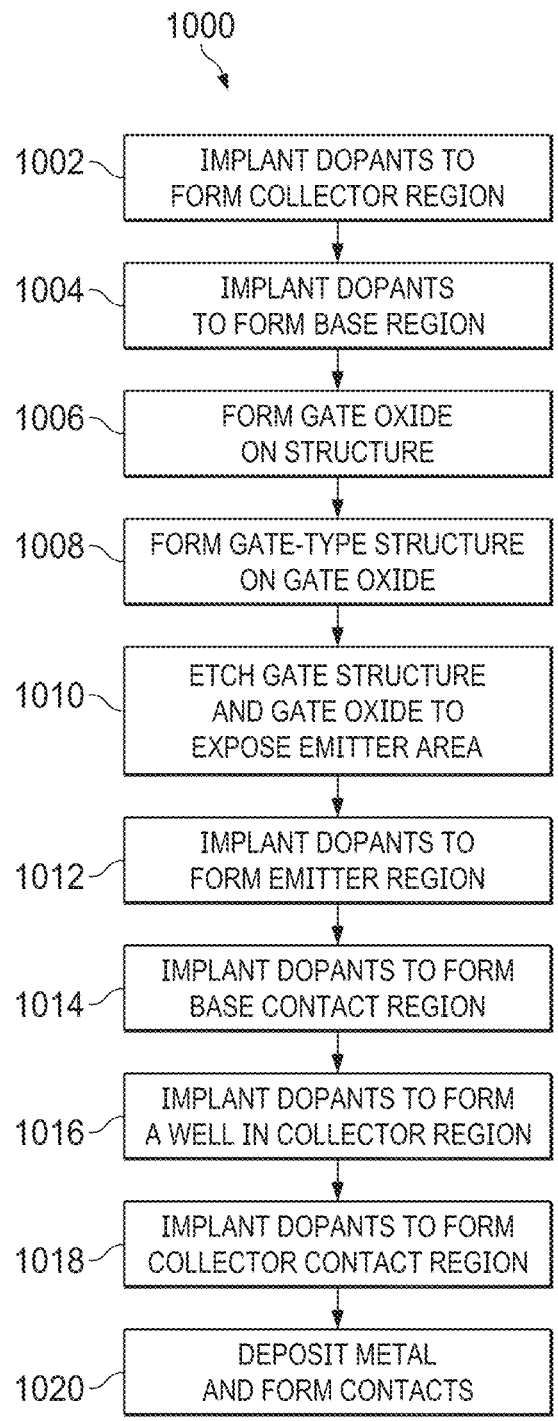
FIG. 10 is a flow diagram depicting an example method for making a bipolar junction transistor.

In view of the foregoing structural and functional features described above, example methods will be better appreciated with reference to FIG. 10. FIG. 10 is a flow diagram depicting an example method 1000 for making a transistor, such as a BJT. The method 1000 may be used to make any of the structures disclosed herein, including the structure 100 of FIG. 1, the structure 200 of FIGS. 2 and 3 or the structure 600 of FIG. 6. While, for purposes of explanation, the example method of FIG. 10 is shown and described as executing serially, the method is not limited by the illustrated order. By way of illustration, the method 1000 of FIG. 10 will be described with respect to FIGS. 11-21 to depict examples of the structure throughout the method 1000.

Figure 11:
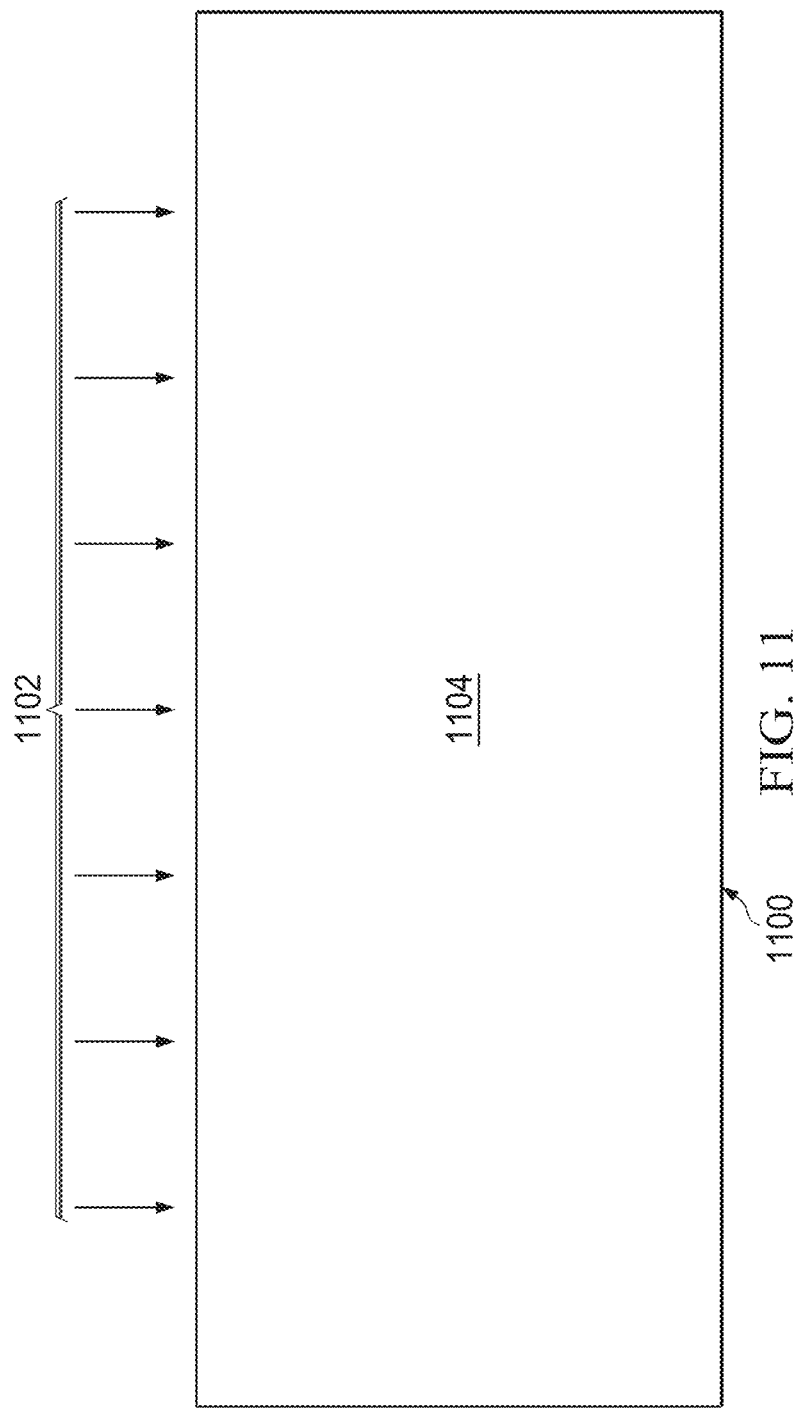
FIGS. 11-21 are cross-sectional view of a transistor being made according to the method of FIG. 10.
Figure 12:
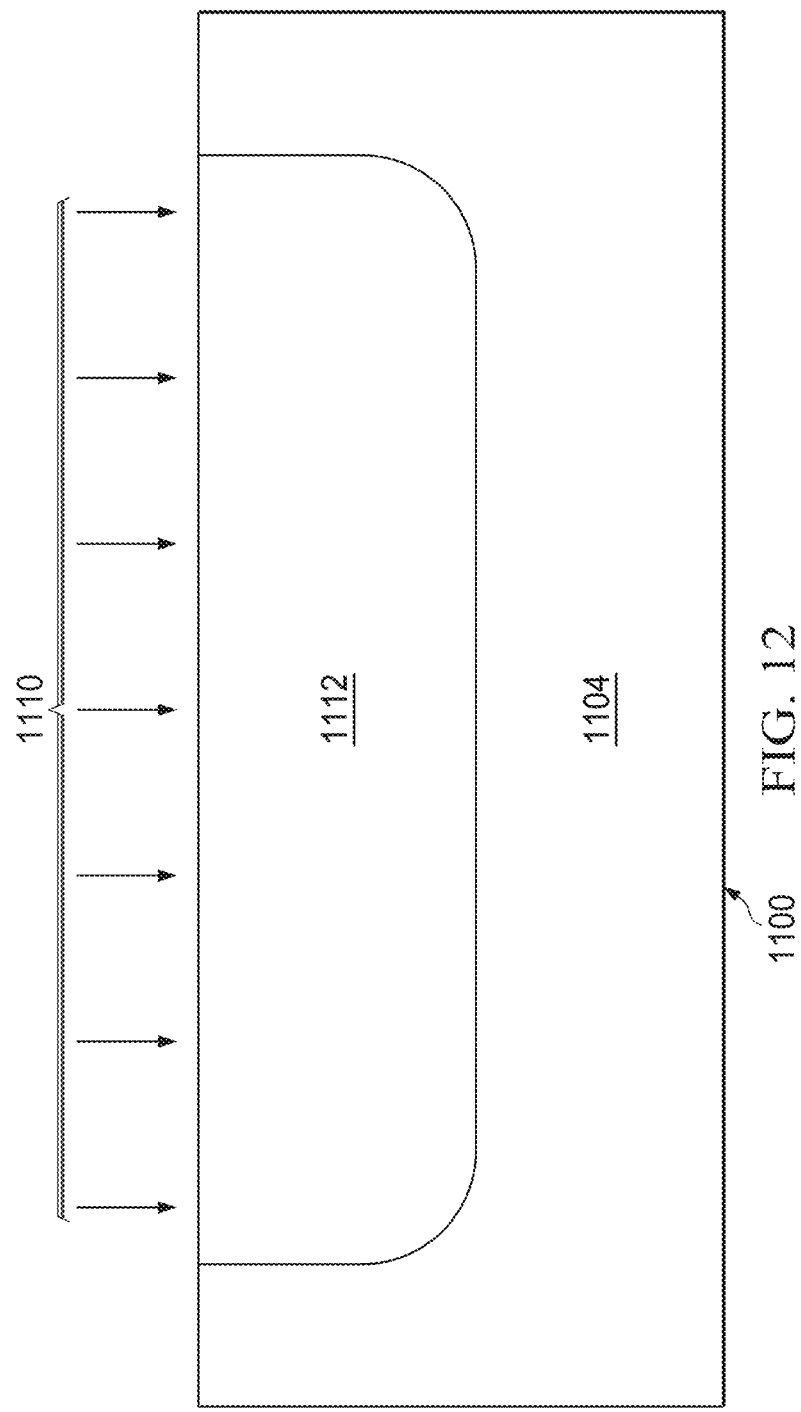
Figure 13:
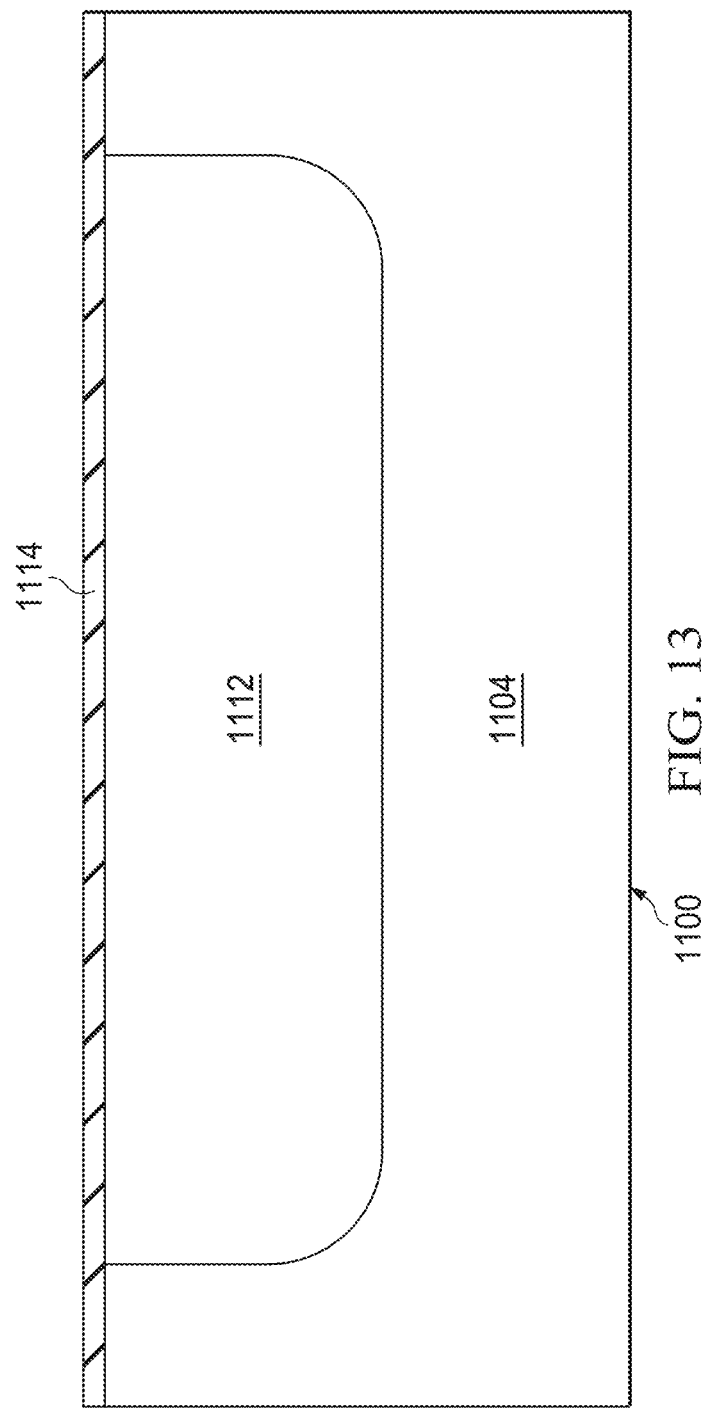

The method 1000 begins at 1002 in which dopants are implanted to form a collector region. For example, as shown in FIG. 11, dopants 1102 are implanted in a semiconductor substrate or epitaxial layer 1100 to form the collector region having majority carriers of a first type, which may be N-type or P-type depending on the type of BJT being fabricated. At 1004, dopants 1110 are implanted in the collector region 1104 to form a base region 1112 having majority carriers of a second type (P-type or N-type), such as shown in FIG. 12.

Figure 14:
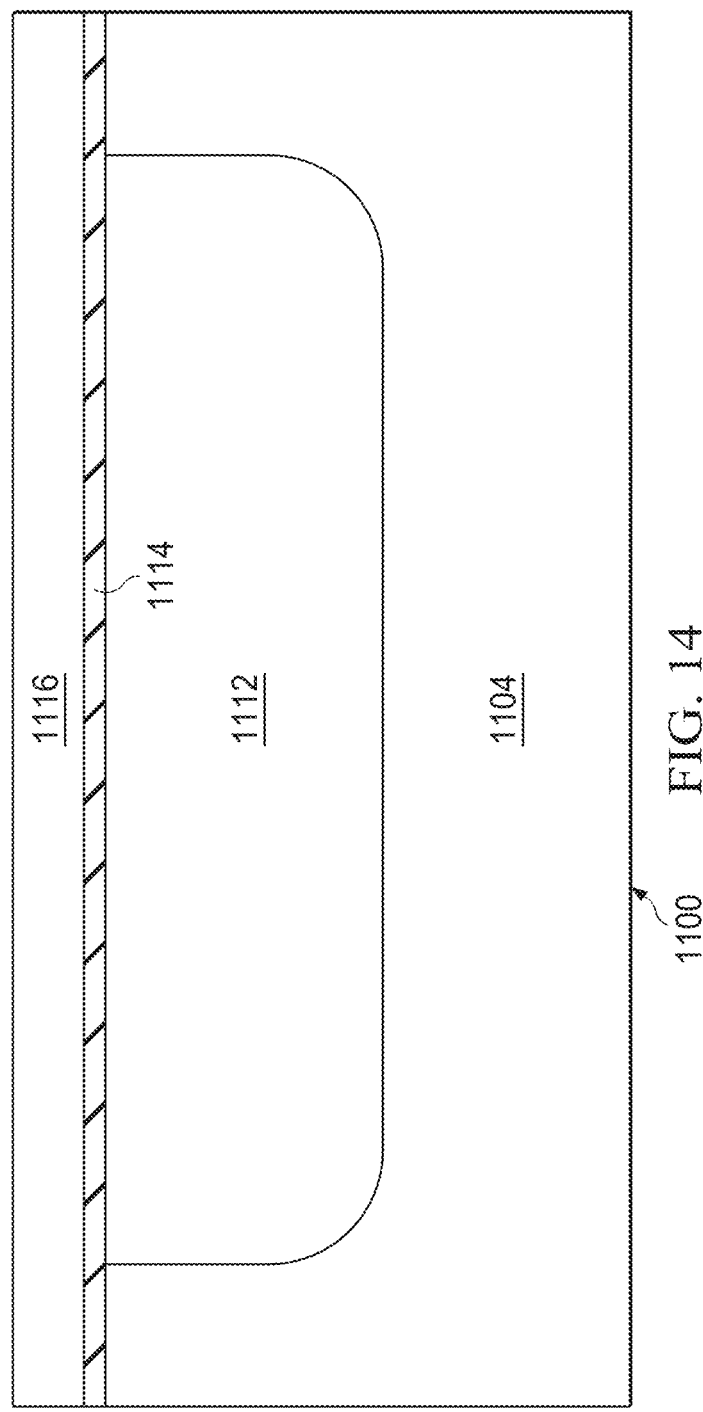

At 1006, a gate oxide is formed on the semiconductor. For example, as shown at 1114 of FIG. 13, the gate oxide may be a layer of $SiO_2$ that is thermally grown by thermal oxidation of the silicon semiconductor substrate or epitaxial layer 1100. At 1008, a gate-type structure is formed on the oxide. For example, as shown in FIG. 14, the gate structure 1116 may be a layer polysilicon material that is deposited over the oxide 1114, such as by chemical vapor deposition of silane in conjunction with forming gates in a CMOS process. In some examples, polysilicon doping may also be performed during the deposition process, such as by adding phosphine, arsine, or diborane depending on the type (N-type and/or P-type) of doping desired.

Figure 15:
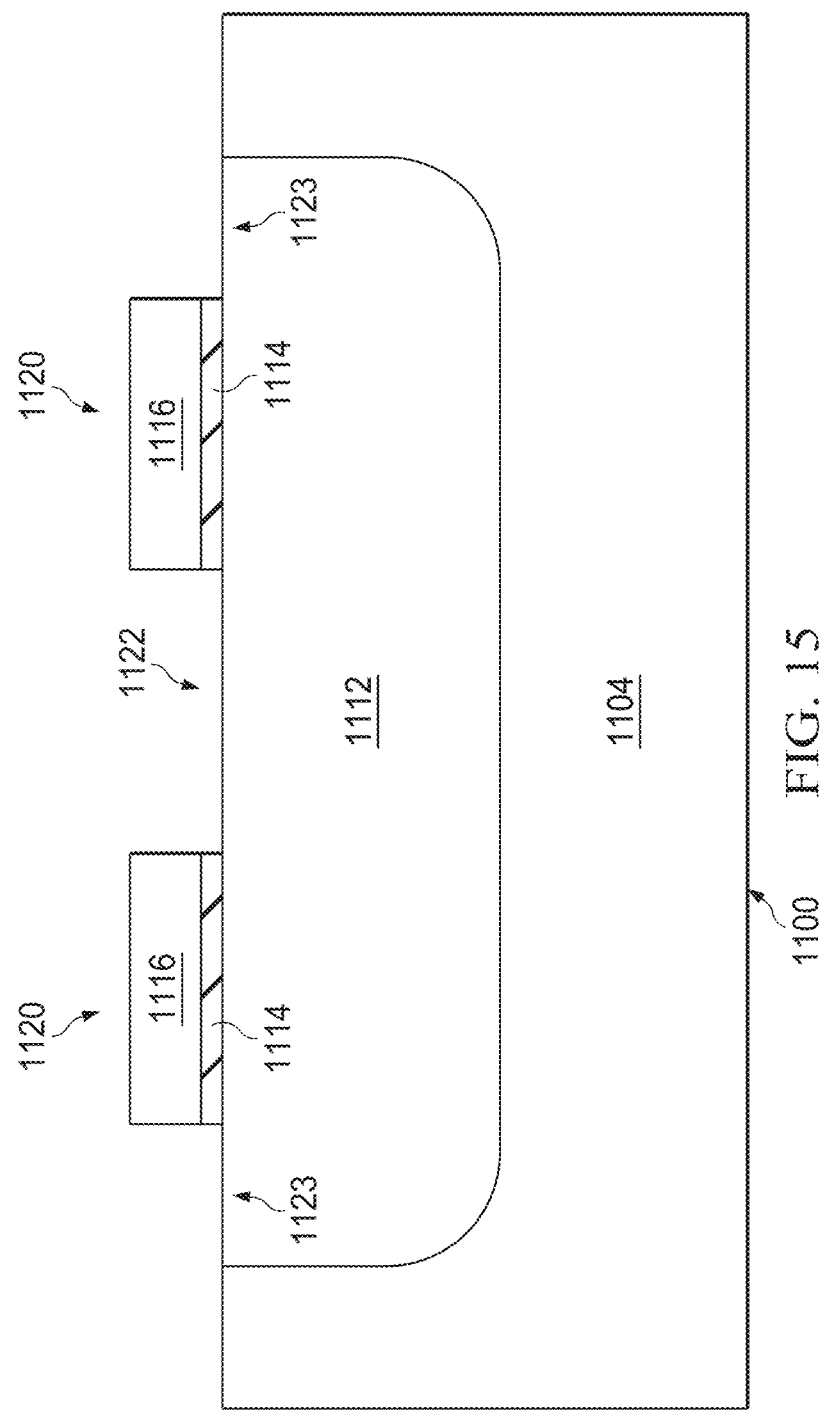
Figure 16:
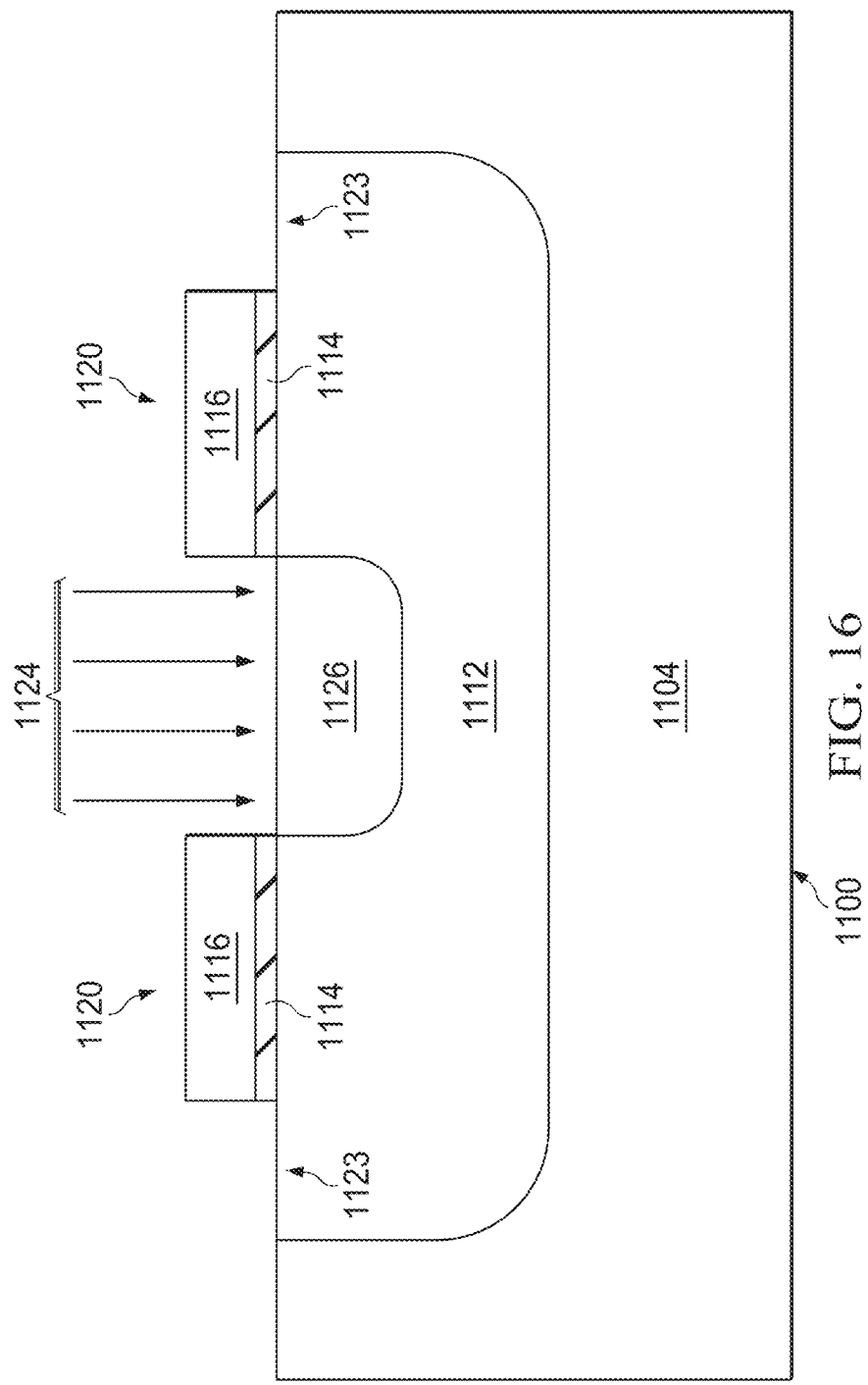
Figure 17:
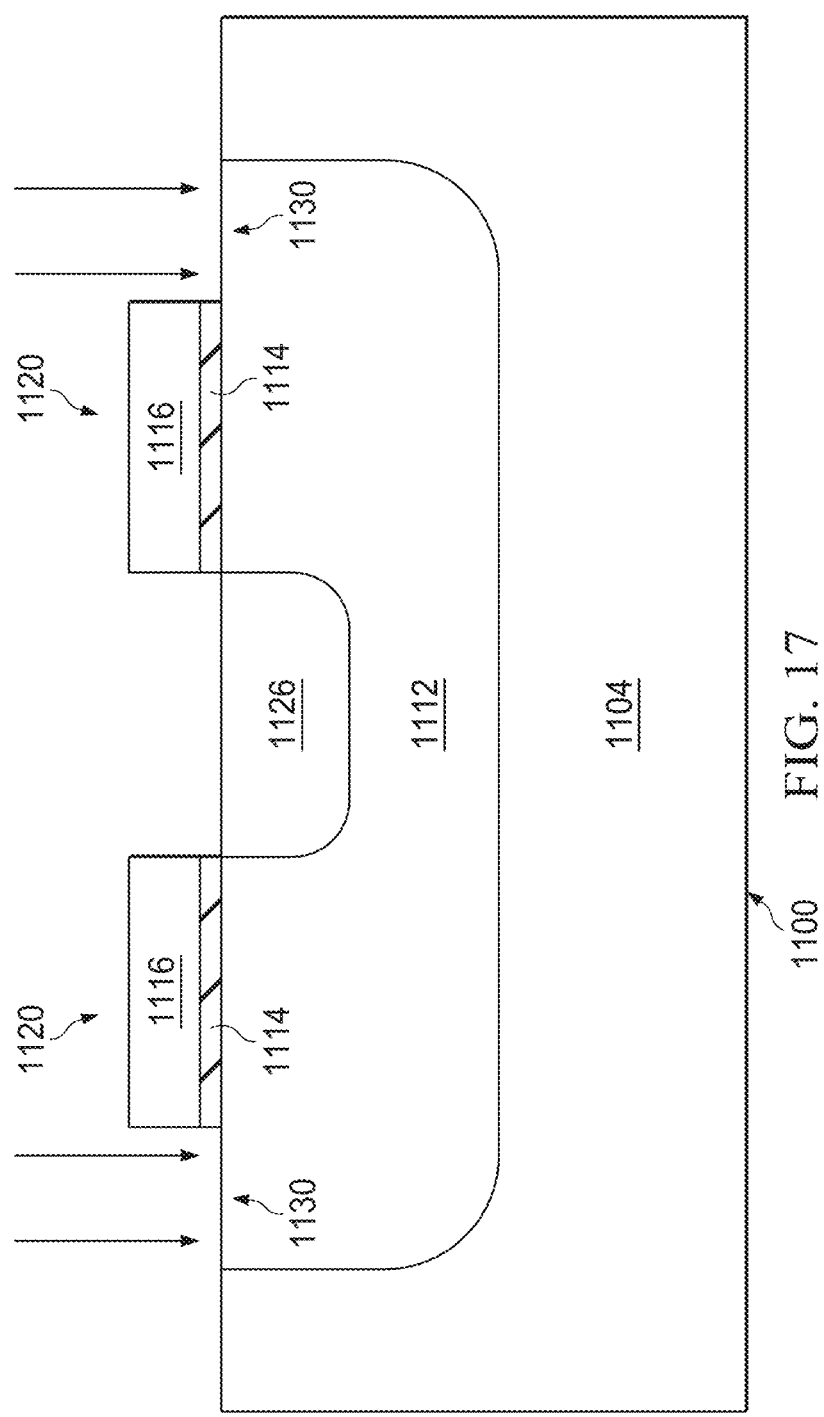
Figure 18:
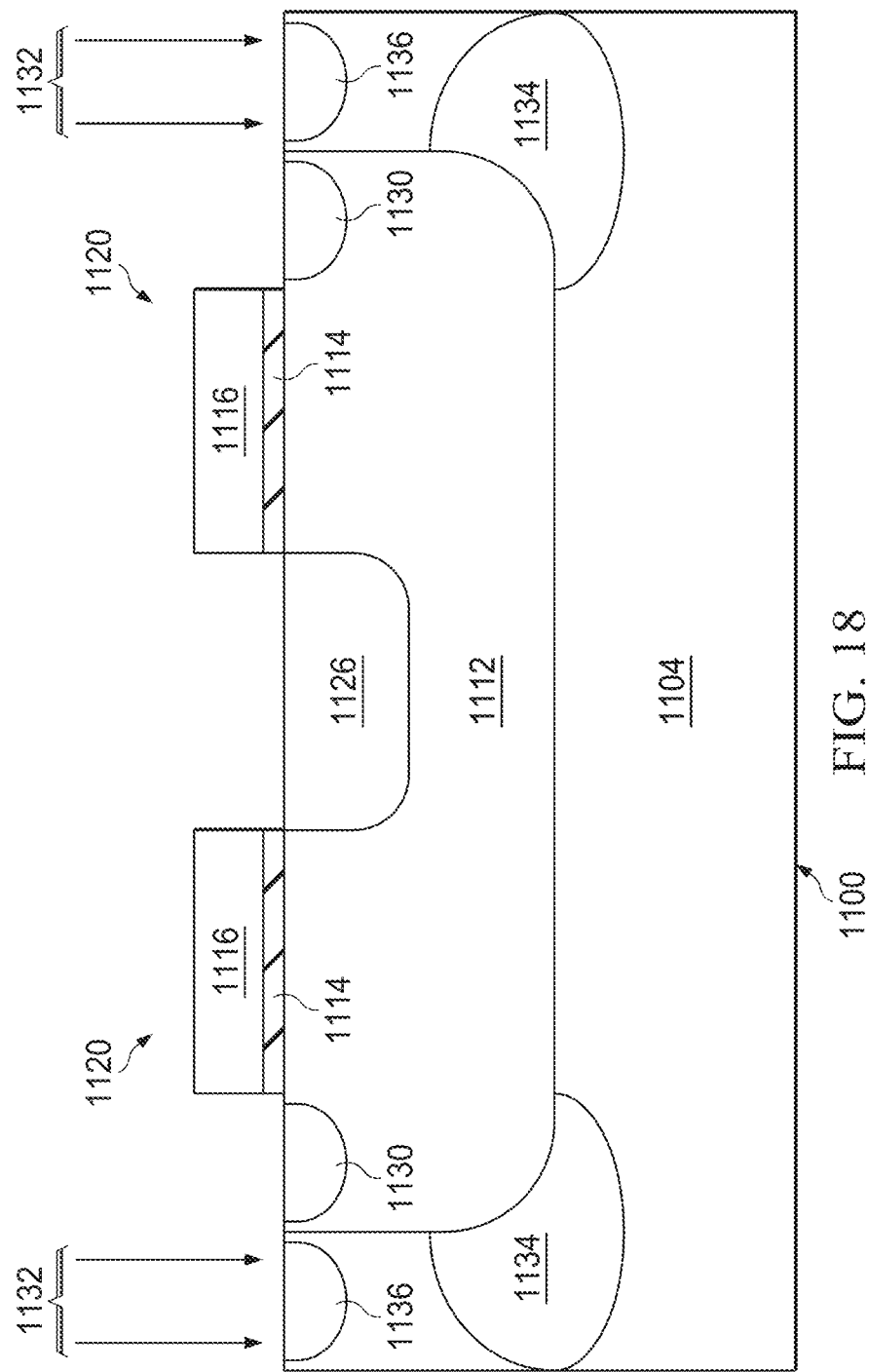

At 1010, the gate material (e.g., polysilicon) and oxide are etched to form expose an emitter area. For example, as shown in FIG. 15, the etching (at 1010) forms a gate-type structure 1120 that surrounds the emitter area 1122 of the base region as well as exposes a base contact area 1123 in the base region 1112. The gate structure (e.g., polysilicon and oxide) after etching at 1010 thus can serve as a hard mask for defining the emitter area, as well as defining other areas for implanting dopants. At 1012, dopants are implanted to form an emitter region to form an emitter region. For example, as shown in FIG. 16, the gate structure 1120 operates as a mask for implanting dopants 1124 to form the emitter region 1126 having majority carriers of the first type (e.g., same type as the collector region) within the base region 1112. At 1014, dopants are implanted to form a base contact region. For example, as shown in FIG. 17, the dopants are implanted in the base contact area to form a base contact region 1130 having majority carriers of the second type. Steps 1016 and 1018 form the collector region of the transistor. For example, as shown in FIG. 18, dopants 1132 are implanted in the collector region 1104 to form a well 1134 having majority carriers of the first type, and dopants are implanted in the well to form a collector contact region 1136 having majority carriers of the first type to make contact with the collector region.

Figure 19:
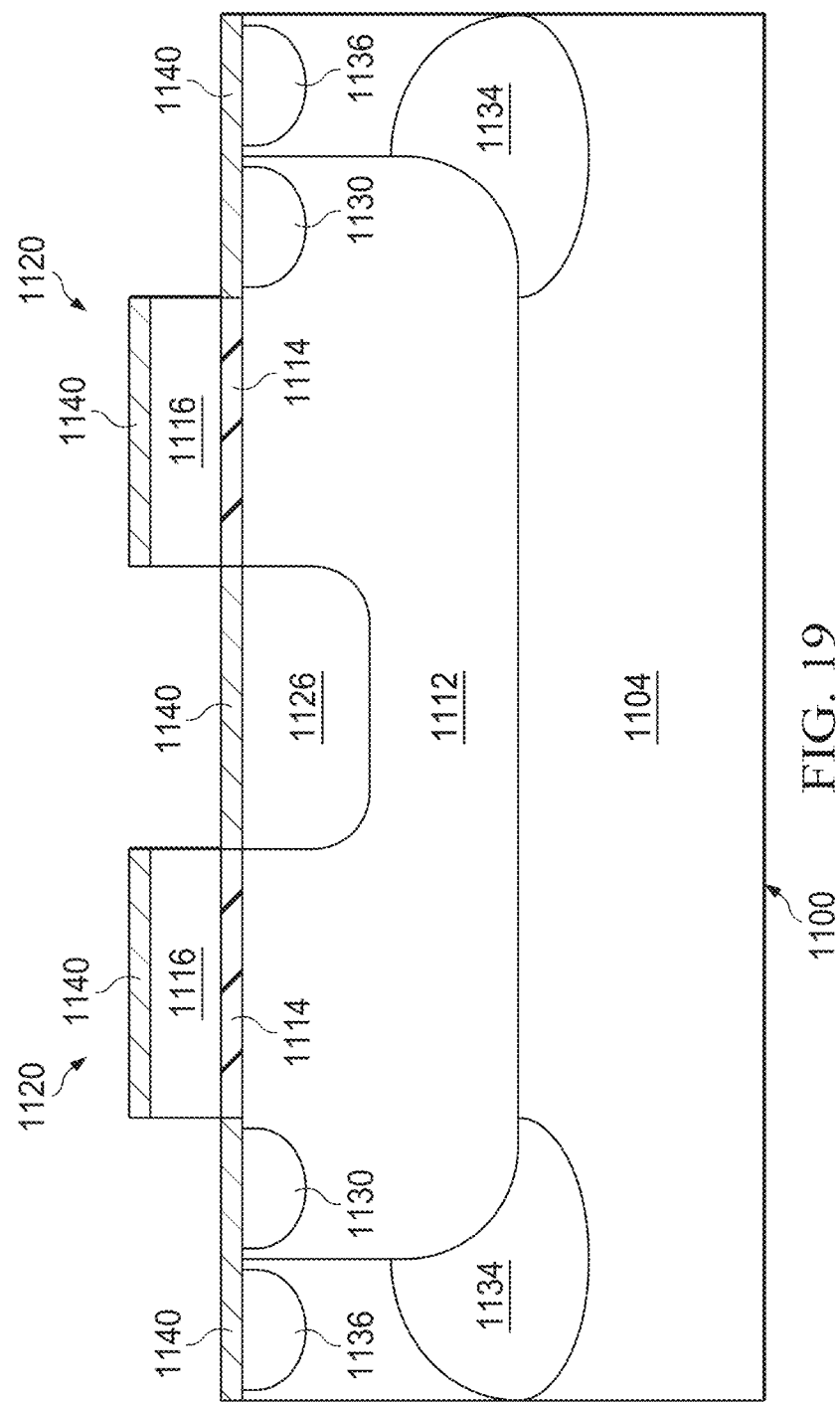
Figure 20:
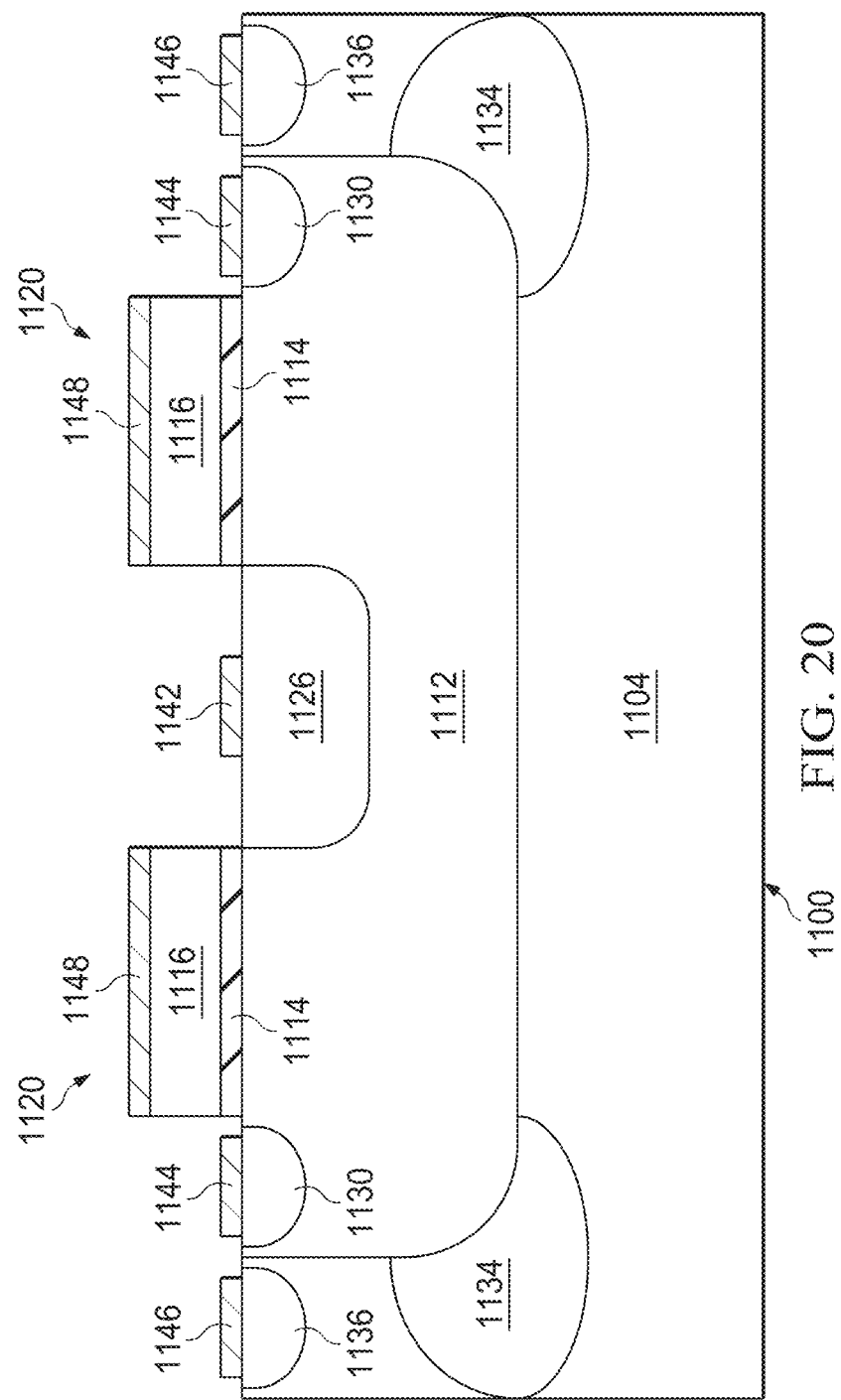
Figure 21:
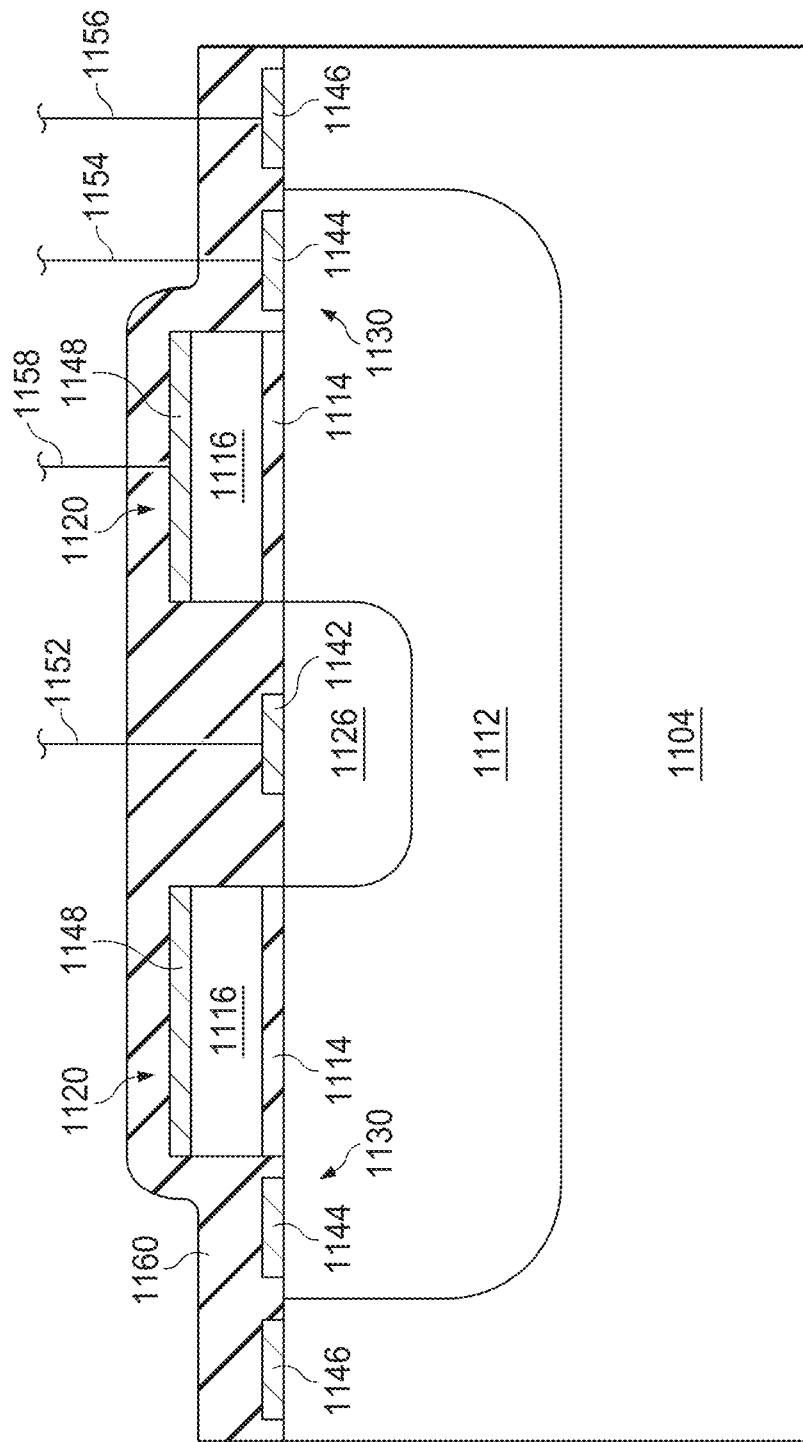

At 1020, a metal is deposited and contacts are formed. For example, as shown in FIG. 19, a metal layer 1140 is deposited over the semiconductor as part of back end of line (BEOL) processing. The metal 1140 may be annealed to form a silicide. The metal layer 1140 then may be etched to form metal contacts, namely, an emitter contact 1142, a base contact 1144, a collector contact 1146 and a gate contact 1148, as shown in FIG. 20. Additional BEOL processing may be performed to form respective connectors (e.g., interconnecting wires) 1152, 1154, 1156 and 1158 isolated by dielectric layers 1160 (e.g., SiO$_2$, a silicate glass, silicon oxycarbide or the like), such as shown in FIG. 21.

In the method 1000, before implanting dopants, a photoresist film is deposited and exposed with radiation by one or more lithography masks, followed by baking and etching of the photoresist film to define a pattern on the semiconductor for the dopant implantation. For ease of explanation, however, such steps have not been included in the method 1000 of FIG. 10 and FIGS. 11-21. As described herein, the gate contact 1158 may be coupled to source of DC bias voltage, such as a terminal. For example, the terminal is coupled to a DC voltage that may be generated by circuitry residing on the same IC die as the transistor or circuitry external to the IC, In operation, the DC bias voltage that is applied to the gate contact from the source of DC bias voltage reduces lateral current flow between the emitter and base regions. The DC bias voltage may be set according to application requirements and desired operating characteristics for the BJT, such as transistor beta and IC ideality and linearity.

In this application, the term "couple" or "couples" means either an indirect or direct connection. Thus, if a first device couples to a second device, that connection may be through a direct connection or through an indirect connection via other devices and connections. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A method of forming a transistor, the method comprising:
    forming a collector region having majority carriers of a first type in a semiconductor substrate;
    forming a base region having majority carriers of a second type;
    forming a gate material over the base region;
    etching the gate material to form a gate-type structure, thereby exposing an emitter area of the base region and exposing a base contact area of the base region, the base contact area surrounding the gate-type structure, and the gate-type structure surrounding the emitter area;
    implanting a first dopant in the emitter area to form an emitter region having majority carriers of the first type;
    implanting a second dopant in the base contact area of the base region to form a base contact region having majority carriers of the second type;
    forming contacts on or over the base contact region, the emitter region, a collector contact region and the gate-type structure; and
    forming a gate connector coupled to the contact of the gate-type structure and adapted to be coupled to a source of DC voltage.

2. The method of claim 1, wherein forming the gate-type structure further comprises:
    forming a gate oxide over the semiconductor substrate; and
    forming the gate material on the gate oxide, the gate material and the gate oxide being etched to form the gate-type structure.

3. The method of claim 2, wherein the gate material comprises polysilicon.

4. The method of claim 2, wherein the gate connector is isolated from the emitter region and the base region.

5. The method of claim 1, wherein a DC voltage source terminal is coupled to the gate-type structure through the gate connector.

6. The method of claim 5, wherein the DC voltage source terminal is adapted to provide a negative DC voltage.

7. The method of claim 1, wherein the first type is N-type-and the second type is P-type.

8. The method of claim 1, wherein the first type is P-type and the second type is N-type.

9. The method of claim 1, wherein forming the contacts further comprises:
    depositing metal over exposed portions of the semiconductor substrate and the gate-type structure; and
    annealing the semiconductor substrate to form silicide on or over the exposed portion of the semiconductor substrate and the gate-type structure.

10. A method of forming an integrated circuit, comprising:
    implanting a dopant having a first conductivity type into a semiconductor substrate to form a first doped region having the first conductivity type;
    implanting a dopant having a second different conductivity type into the first doped region to form a second doped region within the first doped region and having the second conductivity type;
    forming a polysilicon gate-type structure over the first doped region between an area of the second doped region and a contact area of the first doped region, the contact area surrounding the gate-type structure; and
    forming a gate connector coupled to the polysilicon gate-type structure, wherein the gate connector is electrically isolated from the first doped region and the second doped region.

11. The method of claim 10, wherein forming the polysilicon gate-type structure further comprises:
    forming a gate oxide over the semiconductor substrate;
    forming a polysilicon material on the gate oxide, the polysilicon material and the gate oxide being etched to form the polysilicon gate-type structure surrounding the area of the second doped region; and forming a metal gate contact on or over the polysilicon material, the gate connector being coupled to the metal gate contact.

12. A method of forming a transistor, the method comprising:

forming a collector region having electron majority carriers in a semiconductor substrate;

forming a base region having hole majority carriers within the collector region, the collector region surrounding the base region at a top surface of the semiconductor substrate;

forming an emitter region having electron majority carriers within the base region, the base region surrounding the emitter region at the top surface; and forming a polysilicon electrode over the base region between the emitter region and a base contact, the polysilicon electrode configured to place a negative DC bias on the base region during operation of the transistor.

13. The method of claim 12, further comprising forming a dielectric isolation structure that surrounds the base region, a first junction between the collector region and the base region intersecting the dielectric isolation structure, and a second junction between the base region and the emitter region intersecting the top surface.

14. The method of claim 12, wherein the polysilicon electrode is configured to redirect majority carriers in the base region to a deeper portion of the base region during operation of the transistor.

15. The method of claim 12, wherein the polysilicon electrode is configured to receive the negative DC bias from a gate connector that is isolated from the emitter region and the base region.

* * * * *